United States Patent
Bao et al.

(10) Patent No.: US 11,753,424 B2
(45) Date of Patent: Sep. 12, 2023

(54) CRYSTALLINE FORM OF PHENYL BIS (2,4,6-TRIMETHYLBENZOYL) PHOSPHINE OXIDE WITH LARGE PARTICLE SIZE AND CRYSTALLIZATION METHOD FOR MAKING SAME

(71) Applicant: Tianjin University, Tianjin (CN)

(72) Inventors: Ying Bao, Tianjin (CN); Pei Zhao, Tianjin (CN); Mingshuo Chen, Tianjin (CN); Baohong Hou, Tianjin (CN); Chuang Xie, Tianjin (CN); Lina Zhou, Tianjin (CN)

(73) Assignee: Tianjin University, Tianjin (CN)

( * ) Notice: Subject to any disclaimer, the term of this patent is extended or adjusted under 35 U.S.C. 154(b) by 268 days.

(21) Appl. No.: 17/144,223

(22) Filed: Jan. 8, 2021

(65) Prior Publication Data
US 2021/0214380 A1     Jul. 15, 2021

(30) Foreign Application Priority Data
Jan. 10, 2020 (CN) .................. 202010028448.X

(51) Int. Cl.
| | | |
|---|---|---|
| *C07F 9/53* | (2006.01) | |
| *C09D 7/63* | (2018.01) | |
| *C07F 9/02* | (2006.01) | |
| *C08K 5/5397* | (2006.01) | |
| *C09D 167/02* | (2006.01) | |

(52) U.S. Cl.
CPC ............ *C07F 9/5325* (2013.01); *C07F 9/025* (2013.01); *C08K 5/5397* (2013.01); *C09D 7/63* (2018.01); *C09D 167/02* (2013.01); *C07B 2200/13* (2013.01)

(58) Field of Classification Search
CPC ...... C07F 9/5325; C07F 9/025; C08K 5/5397; C09D 7/63; C09D 167/02; C07B 2200/13; C30B 7/14; C30B 29/58
USPC .......................................................... 568/11
See application file for complete search history.

(56) References Cited

FOREIGN PATENT DOCUMENTS

| | | | |
|---|---|---|---|
| CN | 102675365 | A1 | 9/2012 |
| CN | 104151358 | A1 | 11/2014 |
| CN | 104910207 | A * | 8/2015 |
| CN | 104910207 | A1 | 9/2015 |
| CN | 105131036 | A1 | 12/2015 |
| CN | 105646578 | A1 | 6/2016 |
| WO | 200032612 | A1 | 6/2000 |
| WO | 20190066732 | A1 | 4/2019 |

OTHER PUBLICATIONS

Machine translation of CN104910207A, 2015.*
Machine Translation of Abstract of CN 104910207 A; published Sep. 16, 2015; 1 page.
Machine Translation of Abstract of CN 102675365 A; published Sep. 19, 2012; 1 page.
Machine Translation of Abstract of CN 104151358 A; published Nov. 19, 2014; 1 page.
Machine Translation of Abstract of CN 105646578 A; published Jun. 8, 2016; 1 page.
Machine Translation of Abstract of CN 105131036 A; published Dec. 9, 2015; 1 page.
Screen Shot of CCDC Publications; Cambridge Crystallographic Data Centre; CCDC No. 666662; CSD Ref code FOQDIZ; https://ccdc.cam.ac.uk/; 1 page.
Zhao, et al. .; "Predicting the Crystal Habit of Photoinitiator XBPO and Elucidating the Solvent Effect on Crystal Faces"; The Royal Society of Chemistry; CrystEngComm; Published Feb. 22, 2019; vol. 21 (2422-2430);15 pages.
Ying, et al.; "Investigation of Crystallization Process of Phenyl Bis (2, 4, 6-Thrimethylbenzoyl)Phosphine Oxide"; China Academic Journal Electronic Publishing House: Oct. 2019; vol. 52 No. 10; 8 pages.

* cited by examiner

*Primary Examiner* — Ana Z Muresan
(74) *Attorney, Agent, or Firm* — Peter L. Brewer; Thrive IP

(57) ABSTRACT

A crystalline form of phenyl bis (2,4,6-trimethylbenzoyl) phosphine oxide, with a large particle size, which belongs to a triclinic crystal system and space group P-1. A crystallization method for making the crystalline form of phenyl bis (2,4,6-trimethylbenzoyl) phosphine oxide, comprising adding a solid of phenyl bis (2,4,6-trimethylbenzoyl) phosphine oxide to a solvent and mixing; followed by heating to 50 to 70° C. to achieve complete dissolution; cooling the solution to room temperature; and adding an anti-solvent to the resulting solution to cause precipitation of crystals. The crystals are allowed to grow at a constant temperature for 10 to 60 minutes, so as to give a slurry containing the crystals. Said slurry is subjected to filtration and then drying to obtain the crystalline form of phenyl bis (2,4,6-trimethylbenzoyl) phosphine oxide.

13 Claims, 4 Drawing Sheets

CRYSTALLINE FORM OF PHENYL BIS (2,4,6-TRIMETHYLBENZOYL) PHOSPHINE OXIDE WITH LARGE PARTICLE SIZE AND CRYSTALLIZATION METHOD FOR MAKING SAME

CROSS REFERENCE TO RELATED APPLICATIONS

This application claims the benefit of CN 202010028448.X filed Jan. 10, 2020. That application is titled "CRYSTALLINE FORM OF PHENYL BIS (2, 4, 6-TRIMETHYLBENZOYL) PHOSPHINE OXIDE WITH LARGE PARTICLE SIZE AND CRYSTALLIZATION METHOD FOR MAKING SAME."

The preceding application is incorporated herein in its entirety by reference.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

BACKGROUND OF THE INVENTION

This section is intended to introduce various aspects of the art, which may be associated with exemplary embodiments of the present disclosure. This discussion is believed to assist in providing a framework to facilitate a better understanding of particular aspects of the present disclosure. Accordingly, it should be understood that this section should be read in this light, and not necessarily as admissions of prior art.

TECHNICAL FIELD OF THE INVENTION

The present disclosure is related to the field of crystallization, and in particular to a crystalline form of phenyl bis (2,4,6-trimethylbenzoyl) phosphine oxide with a large particle size, as well as to a crystallization method therefor.

BACKGROUND OF THE INVENTION

Phenyl bis (2,4,6-trimethylbenzoyl) phosphine oxide, also known for photoinitiator 819, or photoinitiator XBPO, has a molecular formula of C26H27O3P and a relative molecular weight of 418.46. Its CAS Number is 162881-26-7, and it has a structure represented by the following structural formula I.

Formula I

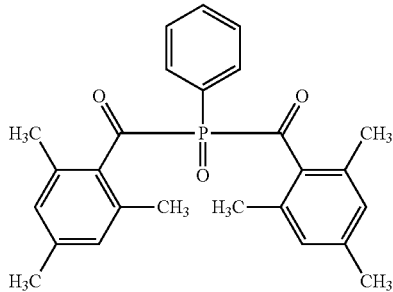

Photoinitiator XBPO, as a highly effective UV initiator, is decomposed into two benzoyl and one phosphorus acyl free radicals by UV irradiation, which can initiate polymerization of monomers. Furthermore, this optical decomposition reaction typically proceeds at a fast speed under the influence of UV irradiation. Accordingly, by using XBPO, a high curing speed can be achieved. Photoinitiator XBPO is highly active, and also has sufficient solubility in the monomers. Further, it also has photobleaching effect, and is suitable for deep curing and pale systems curing. Moreover, photoinitiator XBPO has low volatility and odor, and is environmentally friendly. So, it has been widely used in various fields, such as, unsaturated polyester paint for wood-ware, white paint for wood-ware, UV resistant varnish, UV powder coating, low volatility and odor coatings, thick coatings, optical fiber coating, adhesives, offset ink, screen printing ink, and flexographic ink.

The existing, published patents known to the applicant disclose only one crystalline form of XBPO, designated herein as crystalline form I. As examples, the XBPO crystallization methods described in patent references CN104910207A (2015), CN102675365A (2012), WO00/32612 (2000), CN104151358A (2014), CN105646578A (2016), and CN105131036A (2015) each produce the XBPO crystal in the crystalline form I. The form I typically has a small average particle size, and tends to agglomerate. A typical crystalline morphology of the form I is shown in FIG. 1. As shown, the form I has a primary particle size of 80 μm. Further, the particles may be as small as 20 μm and as large as 150 μm, and thus have a wide particle size range, with the coefficient of variation being greater than 56. Moreover, the angle of repose for the crystal particles is greater than 35 degrees. So, the form I has poor flowability. The crystal particles tend to agglomerate and cake due to their small particle size and wide particle size distribution. On the one hand, these poor properties of the particles may lead to low light absorption and photoinitiation properties of the XBPO crystal in the form I, because mother liquid containing impurities may be encapsulated within the agglomerated particles and has an adverse influence on the product purity. On the other hand, they may seriously adversely affect subsequent processing of the XBPO crystal. For example, the filtration or drying time may be increased.

The prior art patent references related to XBPO are directed mostly to its synthesis method, and only a few of them disclose crystallization methods therefor. For example, CN104910207A (2015) proposes to treat the reaction solution by using a reduced-pressure distillation process to obtain a XBPO crude, which is then recrystallized with a solvent, such as acetonitrile or toluene, to obtain the XBPO crystal in the form I. However, the crystallization solvent used in this method is highly toxic and harmful to human health. Moreover, the patent reference is silent about the specific crystallization conditions. As further examples, according to the processes described in WO00/32612 (2000), CN104151358A (2014), and CN105646578A (2016), reduced-pressure distillation is utilized again to treat the reaction solution and the organic solvent is recovered to give a XBPO crude. The crude is then recrystallized with a solvent to obtain the XBPO crystal in the form I. However, in all these processes, environmentally unfavorable solvents, such as, hexane, heptane, or petroleum ether, are typically used as the crystallization solvent. Also, these patent references are silent about the specific crystallization conditions either. As a yet further example, according to patent reference CN102675365A (2012), a resulting organic phase is subjected to concentration and then crystallization to give the XBPO crystal in the form I. This reference however is silent about the specific crystallization conditions either. While, according to CN105131036A (2015), an organic phase resulting from a reaction is subjected to concentration and then cooling crystallization to give the XBPO crystal in the form I. However, the cooling crystallization process requires high temperature control accuracy, and is complicated, and time and energy consuming.

Therefore, in summary, the prior art XBPO crystallization methods include reduced-pressure distillation and temperature-reduction processes. Disadvantageously, these two processes require high energy consumption and are complicated to carry out. Moreover, no specific crystallization conditions are disclosed. In addition, a bigger problem associated with the processes is that they can produce only the crystalline form I of XBPO as described above, which has a small average particle size and a poor morphology and tends to aggregate, seriously adversely affecting quality and subsequent processing of the final product.

Traditionally, the nucleation and growth rates of crystals are often controlled by optimization of process parameters including temperature decreasing rate, evaporation rate, and addition of seed crystals, such that a lower number of crystal nuclei are formed and the crystals can grow at a faster speed so as to obtain monodispersed crystals with a large particle size and a good morphology. However, there are numerous factors that may impact the crystal nucleation and growth, and extensive experimental work is thus required in order to optimize the process parameters. According to our previous work on this (see: Investigation of Crystallization Process of Phenyl Bis (2,4,6-Thrimethylbenzoyl) Phosphine Oxide, Journal of Tianjin University (Science and Technology), 2019, 52(10), DOI:10.11784/tdxbz201811011), the optimized process conditions requires high accuracy control of temperature, evaporation rate and the like, resulting in a complicated industrial process. In fact, different crystalline forms of the same substance typically exhibit different growth habits and crystal morphologies due to their different crystal structures. The development of a new crystalline form provides a way to improve crystal particle size and morphology and the like. Therefore, it is desired to develop a new crystal form of XBPO, which has a large particle size and a narrow particle size distribution, does not tend to aggregate, and is allowed to be made by a simple crystallization process, that is simple to implement and can improve the performances and production efficiency of the XBPO product.

SUMMARY OF THE INVENTION

Among the objectives of the present disclosure are to provide a new crystalline form of phenyl bis (2,4,6-trimethylbenzoyl) phosphine oxide, which has a large average particle size and a narrow particle size distribution and does not tend to aggregate, as well as to provide a crystallization method therefor. The new crystalline form of phenyl bis (2,4,6-trimethylbenzoyl) phosphine oxide is provided as a pale yellow crystal with a high crystallinity, an intact morphology, a large average particle size, a narrow particle size distribution, and a good flowability (and thus the crystal particles will not tend to aggregate). According to the present disclosure, an anti-solvent crystallization method is employed to make the new crystalline form of phenyl bis (2,4,6-trimethylbenzoyl) phosphine oxide. This method is easy to implement and control and can produce the product in a high yield.

One of the objectives of the present disclosure is realized by a crystalline form of phenyl bis (2,4,6-trimethylbenzoyl) phosphine oxide with a large particle size, which has an X-ray powder diffraction pattern comprising characteristic peaks at 4.7±0.1, 9.3±0.1, 12.2±0.1, 13.5±0.1, 14.0±0.1, 16.2±0.1, 17.3±0.1, 18.7±0.1, 19.6±0.1, and 24.9±0.1 degrees 2θ, as shown in FIG. 2. It belongs to a triclinic crystal system and to a space group P-1. The crystalline form is also characterized by unit cell parameters substantially equal to the following cell dimensions from single crystal:

a=8.0301(16)Å
b=8.6673(17)Å
c=19.252(4)Å
α=84.07(3)°
β=82.83(3)°
γ=63.75(3)°
molecules/unit cell (Z): 2.

Furthermore, the present crystalline form of phenyl bis (2,4,6-trimethylbenzoyl) phosphine oxide has a melting point measured by differential scanning calorimetry (DSC) of 117 to 121° C. (as shown in FIG. 3). In addition, the present crystalline form has a thermo-gravimetric analysis (TGA) profile showing that the crystalline form starts to lose weight at 110±1° C. with a weight loss of 6.9±0.1% and starts to decompose and thus lose weight at 160±1° C., as shown in FIG. 4.

Another objective of the present disclosure is realized by a crystallization method for making the crystalline form of phenyl bis (2,4,6-trimethylbenzoyl) phosphine oxide with a large particle size, comprising steps of:

(1) adding a solid of phenyl bis (2,4,6-trimethylbenzoyl) phosphine oxide to a solvent and mixing with stirring, followed by heating to 50 to 70° C. to achieve complete dissolution and cooling the solution to room temperature; and (2) adding an anti-solvent to the solution obtained in the step (1) to cause precipitation of crystals and allowing the crystals to grow at a constant temperature for 10 to 60 minutes, so as to give a slurry containing the crystals, which is subjected to filtration and then drying to obtain a crystal product of phenyl bis (2,4,6-trimethylbenzoyl) phosphine oxide.

The crystalline form I of phenyl bis (2,4,6-trimethylbenzoyl) phosphine oxide made according to the existing methods, as described above, may be used as the solid in the step (1) of the method. The ratio of the solid phenyl bis (2,4,6-trimethylbenzoyl) phosphine oxide to the solvent in the step (1) may be 0.125 to 0.159 g/mL.

The solvent used in the step (1) may be a ketone, an ester, or a mixture thereof. The ketone may be selected from acetone, 2-butanone, cyclohexanone, and methyl isobutyl ketone. The ester may be selected from methyl acetate, ethyl acetate, ethyl n-valerate, ethyl propionate, and n-butyl acetate.

The stirring in the step (1) may be carried out with a stirring speed of 50 to 300 rpm.

The anti-solvent may be an alcohol, an alkane, or a mixture thereof. The alcohol may be selected from methanol, ethanol, isopropanol, ethylene glycol, and glycerol. The alkane may be selected from n-heptane, cyclopentane, n-hexane, and petroleum ether.

The anti-solvent may be used in an amount of 0.4 to 3 times by volume the amount of the solvent in the step (1), and may be added to the solution obtained in the step (1) at a rate of 0.2 to 45% by volume with respect to the total volume of the anti-solvent per minute.

The drying in the step (2) may be carried out under vacuum at 50 to 60° C. until constant weight is reached.

Anti-solvent crystallization is a commonly used method to produce crystals. Typically, a solvent A is used to dissolve a substance to be crystallized, and an anti-solvent B, which is miscible with the solvent A and cannot dissolve the substance, is added to the solution of the solvent A and the substance, so as to reduce the solubility of the substance in the solution to cause precipitation of the substance as a crystal. Generally, during anti-solvent crystallization, the addition of an anti-solvent will induce super-high supersaturation in a local region of the bulk solution, causing burst nucleation and producing crystals which have small particle sizes and are sensitive to aggregation. This crystallization method is often used to produce spherical agglomerated crystals. In contrast, the present disclosure attempts to use a suitable solvent for dissolving the substance to be crystallized and a suitable anti-solvent, and suitable temperature and stirring speeds to achieve a proper mass transfer rate and to control nucleation and growth of crystals. The crystal product of phenyl bis (2,4,6-trimethylbenzoyl) phosphine oxide made by the present method is superior to existing products in terms of crystal habit, particle size, flowability, and optical absorption and photoinitiation properties.

The present crystalline form of phenyl bis (2,4,6-trimethylbenzoyl) phosphine oxide and the crystallization method therefor provide several advantages over the prior art.

A comparison between the present crystalline form and the above form I made according to the existing methods is shown in FIG. 5. As shown in this figure, the present crystalline form exhibits an X-ray powder diffraction pattern having characteristic peaks at about 4.68, 9.29, 12.20, 13.49, 13.96, 16.19, 17.27, 18.67, 19.64, and 24.88 degrees 2θ, while the form I exhibits an X-ray powder diffraction pattern having characteristic peaks at about 7.66, 10.06, 11.42, 11.75, 13.99, 15.06, 15.87, 20.09, 25.48, and 25.88 degrees 2θ. This indicates that the present crystalline form has significantly different PXRD characteristic peaks from the form I.

Compared with the existing methods which produce phenyl bis (2,4,6-trimethylbenzoyl) phosphine oxide as the crystalline form I, that is sensitive to aggregation and has a small particle size and relatively poor optical absorption and photoinitiation properties, the present crystalline form made according to the present method has a large particle size and a narrow particle size distribution, as well as improved optical absorption and photoinitiation properties.

The present crystalline form made by the present method can have a purity greater than 99%, a regular block-like and intact morphology, and do not tend to aggregate, as shown in FIG. 6. Furthermore, as shown in FIG. 2, the present crystalline form of phenyl bis (2,4,6-trimethylbenzoyl) phosphine oxide has strong PXRD characteristic peaks, which indicates that the crystalline form made according to the present method has high crystallinity. The crystalline form of phenyl bis (2,4,6-trimethylbenzoyl) phosphine oxide according to the present disclosure has a primary particle size of 400 μm or greater, a narrow particle size distribution with a variation coefficient of 38.6, and a good flowability with the angle of repose being 23 degrees, and does not tend to aggregate or break. The characteristics of the crystal product according to the disclosure, including large particle size, intact morphology, narrow particle size distribution, and free of aggregation, can result in improved operational efficiency and product performances. The crystalline form I of phenyl bis (2,4,6-trimethylbenzoyl) phosphine oxide may require 18 hours to dry out, while the present crystalline form can become completely dry within about 8 hours, with a substantial reduction in drying time, due to its large particle size, good flowability and the like. In addition, the crystallization method of the disclosure is an anti-solvent crystallization process carried out at a constant temperature, and has advantages such as simple process, mild conditions, short production cycle, high yield of 90% or greater, and high purity of 99% or greater. Moreover, the main and auxiliary raw materials used are cheap, and readily available and cause low environmental pollution. So, the method of the present disclosure is easy to realize industrialization production.

DETAILED DESCRIPTION OF EXEMPLARY EMBODIMENTS

Embodiments of the present disclosure provide a crystalline form of phenyl bis (2,4,6-trimethylbenzoyl) phosphine oxide with a large particle size and a crystallization method therefor. The embodiments of the present disclosure will now be further described in detail with reference to examples.

Example 1

5.4 g of phenyl bis (2,4,6-trimethylbenzoyl) phosphine oxide in the crystalline form I was dissolved in 34 mL of acetone and stirred with a stirring speed of 100 rpm. The mixture was heated to 50° C. to completely dissolve the solid therein and was then cooled to room temperature. 64 mL of n-heptane as an anti-solvent was added to the solution at a rate of 19 mL/min to precipitate crystals of phenyl bis (2,4,6-trimethylbenzoyl) phosphine oxide. After completion of the addition, the precipitated crystals were allowed to grow at a constant temperature for 30 minutes. The resulting slurry containing the crystals was subjected to filtration. The filter cake was dried under vacuum at 60° C. to constant weight to obtain a crystal product of phenyl bis (2,4,6-trimethylbenzoyl) phosphine oxide.

Figure 1:
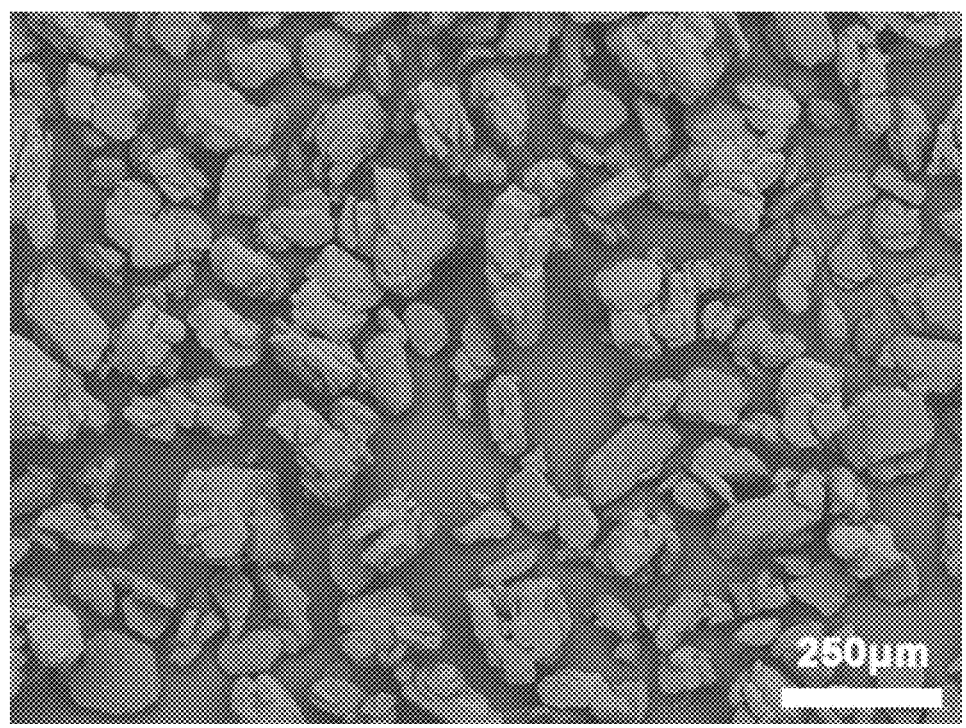
FIG. 1 is a Scanning Electron Micrograph (SEM) of the crystalline form I of XBPO made according to the existing methods.
Figure 2:
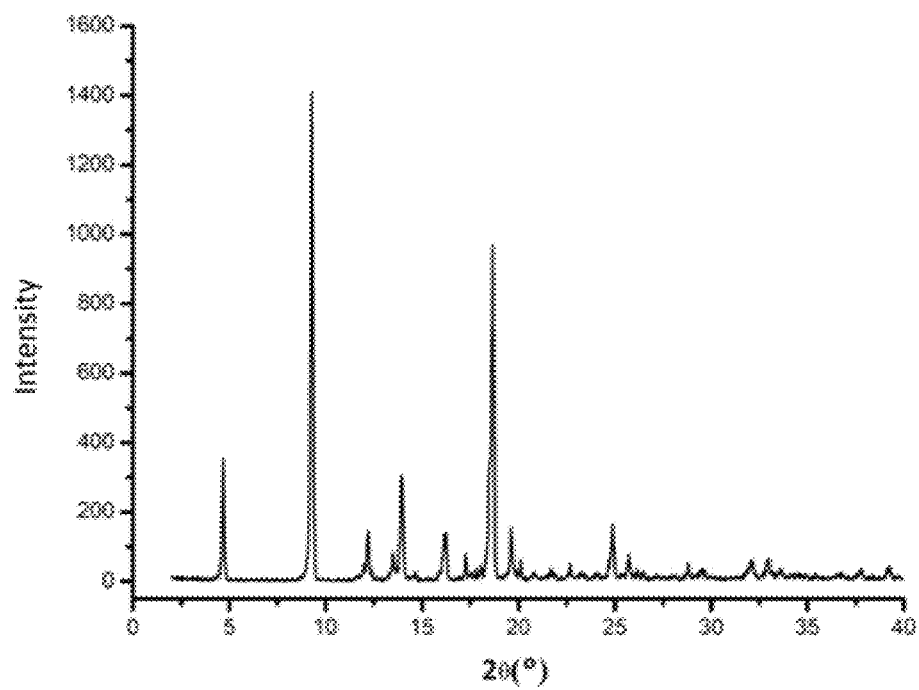
FIG. 2 is a X-ray Powder Diffraction (XRPD) pattern of the crystalline form of XBPO according to the present disclosure.
Figure 3:
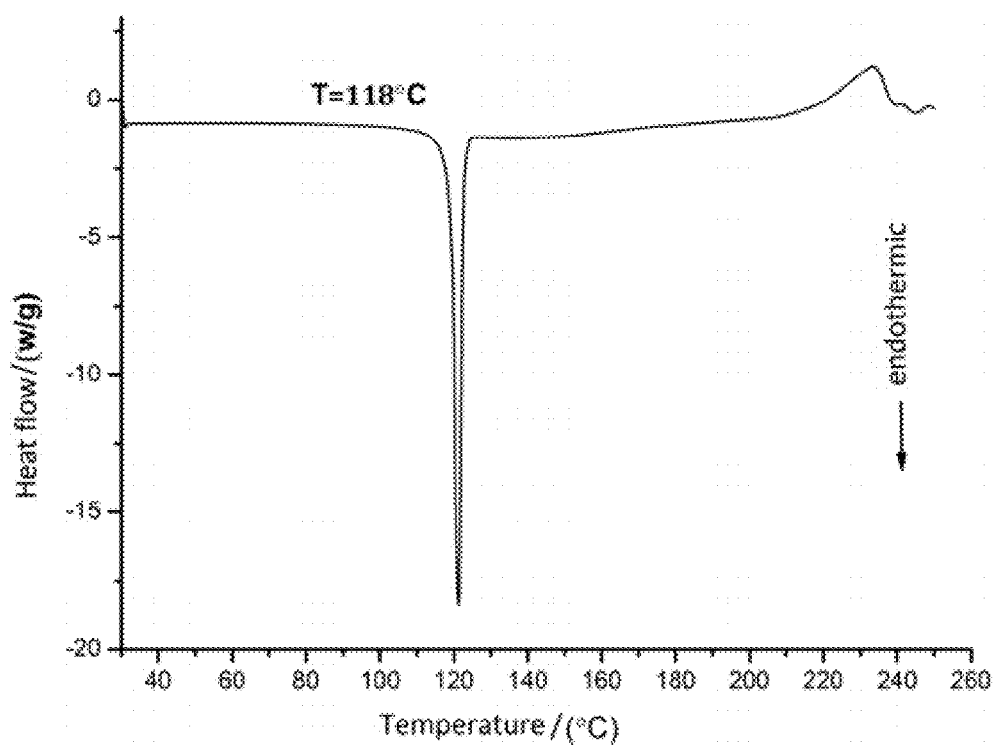
FIG. 3 is a Differential Scanning calorimetry (DSC) curve of the crystalline form of XBPO according to the present disclosure.
Figure 4:
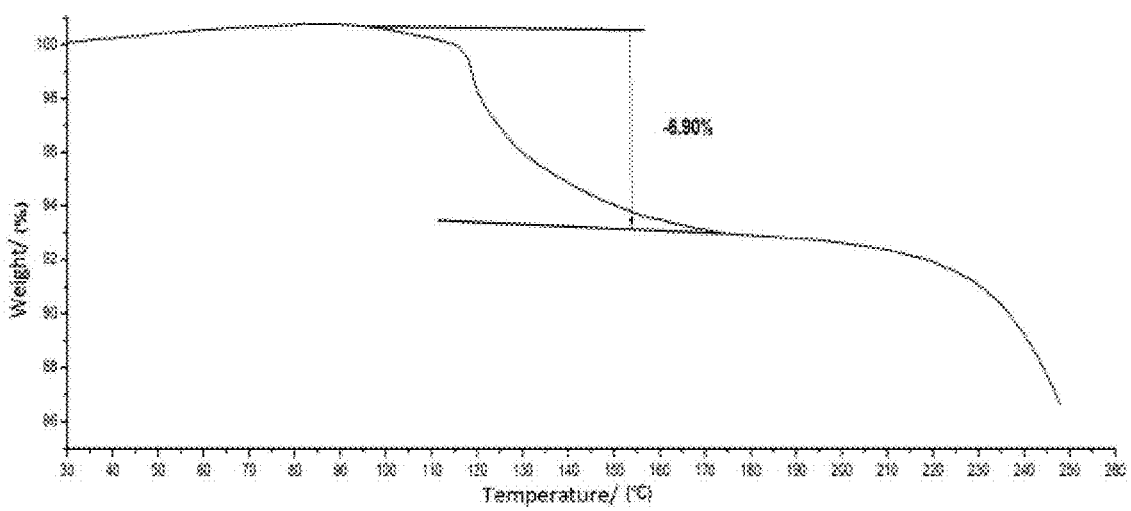
FIG. 4 is a Thermo-Gravimetric Analysis (TGA) curve of the crystalline form of XBPO according to the present disclosure.
Figure 5:
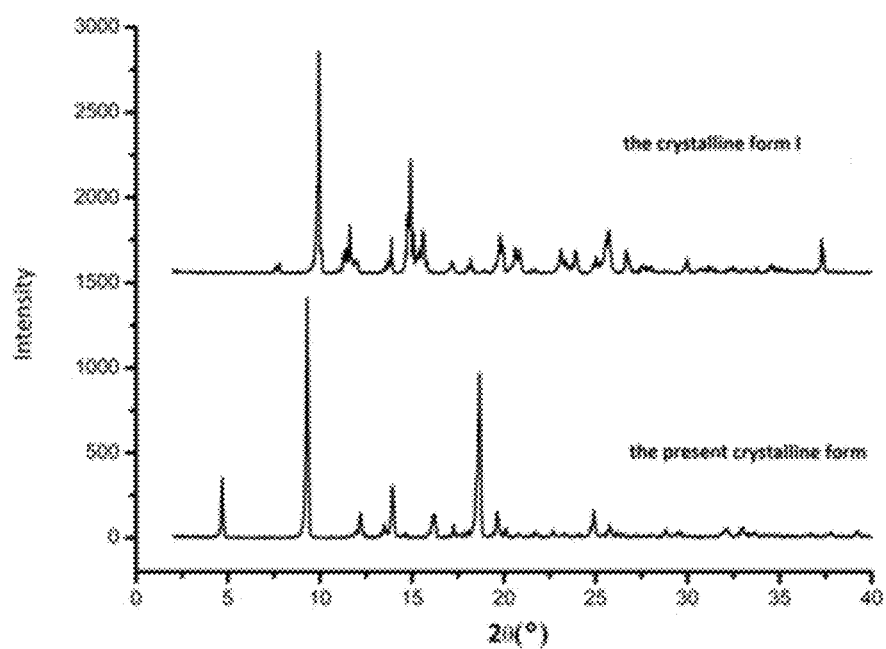
FIG. 5 shows a PXRD comparison between the crystalline form of XBPO according to the present disclosure and the crystalline form I made according to the existing methods.
Figure 6:
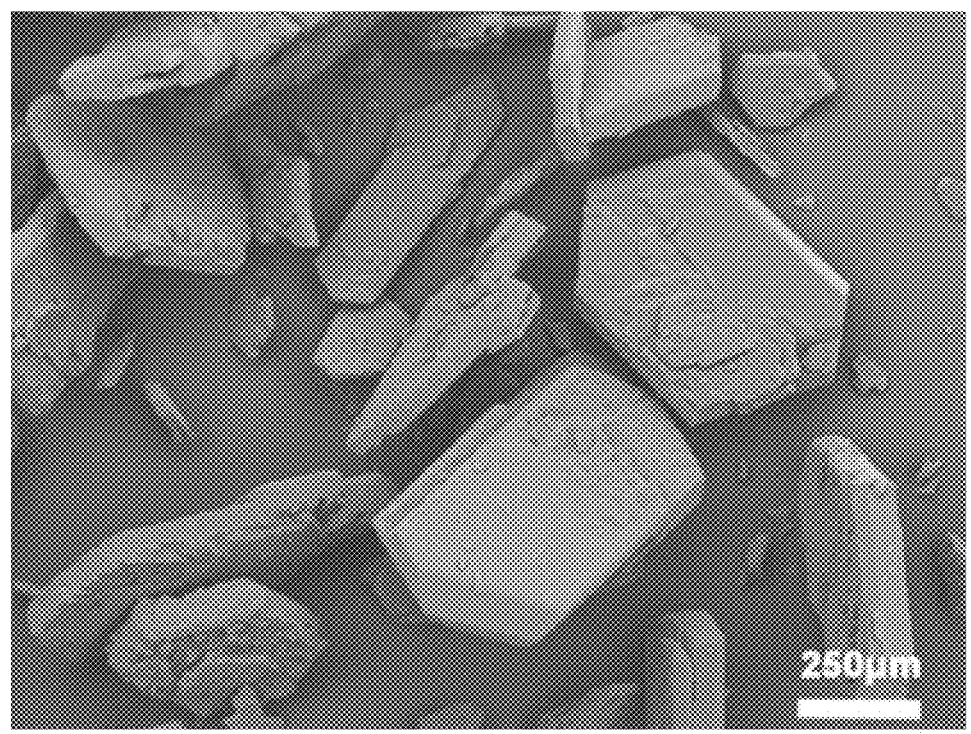
FIG. 6 is a Scanning Electron Micrograph (SEM) of the crystalline form of XBPO according to the present disclosure.

It was found that the crystal product of phenyl bis (2,4,6-trimethylbenzoyl) phosphine oxide obtained in this Example had an X-ray powder diffraction pattern with characteristic peaks at about 4.68, 9.29, 12.20, 13.49, 13.96, 16.19, 17.27, 18.67, 19.64, and 24.88 degrees 2θ. Furthermore, its melting point was determined by differential scanning calorimetry (DSC) and found to be 117° C. Characterization of this product by TGA (Thermo-Gravimetric Analysis) showed that it started to lose weight at 110° C. with a weight loss of 6.8% and started to decompose and thus lose weight at 160° C. A SEM photograph of the product is shown in FIG. 6. It can be seen that the primary particle size of the crystal product was 400 μm or greater, and the crystal product had a large particle size and a narrow particle size distribution. Further, it was found that the crystal product had improved optical absorption and photoinitiation properties.

Example 2

9 g of phenyl bis (2,4,6-trimethylbenzoyl) phosphine oxide in the crystalline form I was dissolved in 69 mL of methyl acetate and stirred with a stirring speed of 300 rpm. The mixture was heated to 70° C. to completely dissolve the solid therein and was then cooled to room temperature. 207 mL of ethanol as an anti-solvent was added to the solution at a rate of 0.4 mL/min to precipitate crystals of phenyl bis (2,4,6-trimethylbenzoyl) phosphine oxide. After completion of the addition, the precipitated crystals were allowed to grow at a constant temperature for 10 minutes. The resulting slurry containing the crystals was subjected to filtration. The filter cake was dried under vacuum at 50° C. to constant weight to obtain a crystal product of phenyl bis (2,4,6-trimethylbenzoyl) phosphine oxide.

It was found that the crystal product of phenyl bis (2,4,6-trimethylbenzoyl) phosphine oxide obtained in this Example had an X-ray powder diffraction pattern with characteristic peaks at about 4.75, 9.26, 12.26, 13.57, 13.93, 16.26, 17.37, 18.62, 19.60, and 24.83 degrees 2θ. Furthermore, its melting point was determined by differential scanning calorimetry (DSC) and found to be 121° C. Characterization of this product by TGA (Thermo-Gravimetric Analysis) showed that it started to lose weight at 109° C. with a weight loss of 6.9% and started to decompose and thus lose weight at 161° C. It was also found that the primary particle size of the crystal product was 420 μm, and the crystal product had a large particle size and a narrow particle size distribution. Further, it was found that the crystal product had improved optical absorption and photoinitiation properties.

Example 3

5.4 g of phenyl bis (2,4,6-trimethylbenzoyl) phosphine oxide in the crystalline form I was dissolved in a mixed solution of 19 mL of 2-butanone and 19 mL of ethyl acetate and stirred with a stirring speed of 50 rpm. The resulting mixture was heated to 60° C. to completely dissolve the solid therein and was then cooled to room temperature. 15 mL of glycol as an anti-solvent was added to the solution at a rate of 6.8 mL/min to precipitate crystals of phenyl bis (2,4,6-trimethylbenzoyl) phosphine oxide. After completion of the addition, the precipitated crystals were allowed to grow at a constant temperature for 60 minutes. The resulting slurry containing the crystals was subjected to filtration. The filter cake was dried under vacuum at 55° C. to constant weight to obtain a crystal product of phenyl bis (2,4,6-trimethylbenzoyl) phosphine oxide.

It was found that the crystal product of phenyl bis (2,4,6-trimethylbenzoyl) phosphine oxide obtained in this Example had an X-ray powder diffraction pattern with characteristic peaks at about 4.69, 9.22, 12.27, 13.41, 13.92, 16.22, 17.24, 18.68, 19.61, and 24.86 degrees 2θ. Furthermore, its melting point was determined by differential scanning calorimetry (DSC) and found to be 119° C. Characterization of this product by TGA (Thermo-Gravimetric Analysis) showed that it started to lose weight at 111° C. with a weight loss of 7.0% and started to decompose and thus lose weight at 159° C. It was also found that the primary particle size of the crystal product was 450 μm, and the crystal product had a large particle size and a narrow particle size distribution. Further, it was found that the crystal product had improved optical absorption and photoinitiation properties.

Example 4

9 g of phenyl bis (2,4,6-trimethylbenzoyl) phosphine oxide in the crystalline form I was dissolved in a mixed solution of 32 mL of cyclohexanone and 32 mL of butyl acetate and stirred with a stirring speed of 200 rpm. The resulting mixture was heated to 55° C. to completely dissolve the solid therein and was then cooled to room temperature. 64 mL of a mixed solvent of methanol and n-hexane, as an anti-solvent, was added to the solution at a rate of 13 mL/min to precipitate crystals of phenyl bis (2,4,6-trimethylbenzoyl) phosphine oxide. After completion of the addition, the precipitated crystals were allowed to grow at a constant temperature for 20 minutes. The resulting slurry containing the crystals was subjected to filtration. The filter cake was dried under vacuum at 50° C. to constant weight to obtain a crystal product of phenyl bis (2,4,6-trimethylbenzoyl) phosphine oxide.

It was found that the crystal product of phenyl bis (2,4,6-trimethylbenzoyl) phosphine oxide obtained in this Example had an X-ray powder diffraction pattern with characteristic peaks at about 4.72, 9.36, 12.26, 13.43, 13.90, 16.16, 17.25, 18.66, 19.68, and 24.82 degrees 2θ. Furthermore, its melting point was determined by differential scanning calorimetry (DSC) and found to be 118° C. Characterization of this product by TGA (Thermo-Gravimetric Analysis) showed that it started to lose weight at 110° C. with a weight loss of 6.9% and started to decompose and thus lose weight at 160° C. It was also found that the primary particle size of the crystal product was 460 μm, and the crystal product had a large particle size and a narrow particle size distribution. Further, it was found that the crystal product had improved optical absorption and photoinitiation properties.

Example 5

9 g of phenyl bis (2,4,6-trimethylbenzoyl) phosphine oxide in the crystalline form I was dissolved in a mixed solvent of 29.29 mL of methyl isobutyl ketone and 29.29 mL of ethyl propionate and stirred with a stirring speed of 150 rpm. The resulting mixture was heated to 65° C. to completely dissolve the solid therein and was then cooled to room temperature. 87.87 mL of a mixed solvent of isopropanol and petroleum ether, as an anti-solvent, was added to the solution at a rate of 8.8 mL/min to precipitate crystals of phenyl bis (2,4,6-trimethylbenzoyl) phosphine oxide. After completion of the addition, the precipitated crystals were allowed to grow at a constant temperature for 40 minutes. The resulting slurry containing the crystals was subjected to filtration. The filter cake was dried under vacuum at 60° C.

to constant weight to obtain a crystal product of phenyl bis (2,4,6-trimethylbenzoyl) phosphine oxide.

It was found that the crystal product of phenyl bis (2,4,6-trimethylbenzoyl) phosphine oxide obtained in this Example had an X-ray powder diffraction pattern with characteristic peaks at about 4.78, 9.31, 12.18, 13.45, 13.92, 16.25, 17.28, 18.63, 19.66, and 24.85 degrees 2θ. Furthermore, its melting point was determined by differential scanning calorimetry (DSC) and found to be 120° C. Characterization of this product by TGA (Thermo-Gravimetric Analysis) showed that it started to lose weight at 109° C. with a weight loss of 6.8% and started to decompose and thus lose weight at 161° C. It was also found that the primary particle size of the crystal product was 405 μm, and the crystal product had a large particle size and a narrow particle size distribution. Further, it was found that the crystal product had improved optical absorption and photoinitiation properties.

Example 6

9 g of phenyl bis (2,4,6-trimethylbenzoyl) phosphine oxide in the crystalline form I was dissolved in a mixed solvent of 36 mL of acetone and 36 mL of ethyl n-valerate and stirred with a stirring speed of 250 rpm. The resulting mixture was heated to 70° C. to completely dissolve the solid therein and was then cooled to room temperature. 50 mL of a mixed solvent of glycerol and cyclopentane, as an anti-solvent, was added to the solution at a rate of 0.4 mL/min to precipitate crystals of phenyl bis (2,4,6-trimethylbenzoyl) phosphine oxide. After completion of the addition, the precipitated crystals were allowed to grow at a constant temperature for 50 minutes. The resulting slurry containing the crystals was subjected to filtration. The filter cake was dried under vacuum at 60° C. to constant weight to obtain a crystal product of phenyl bis (2,4,6-trimethylbenzoyl) phosphine oxide.

It was found that the crystal product of phenyl bis (2,4,6-trimethylbenzoyl) phosphine oxide obtained in this Example had an X-ray powder diffraction pattern with characteristic peaks at about 4.62, 9.23, 12.17, 13.44, 13.93, 16.17, 17.22, 18.60, 19.56, and 24.88 degrees 2θ. Furthermore, its melting point was determined by differential scanning calorimetry (DSC) and found to be 119° C. Characterization of this product by TGA (Thermo-Gravimetric Analysis) showed that it started to lose weight at 110° C. with a weight loss of 7.0% and started to decompose and thus lose weight at 159° C. It was also found that the primary particle size of the crystal product was 425 μm, and the crystal product had a large particle size and a narrow particle size distribution. Further, it was found that the crystal product had improved optical absorption and photoinitiation properties.

The following performance tests were run to compare the present crystal product with a crystal product made according to the known methods, from which the advantageous effects provided by the disclosure will be further apparent.

Test 1: Testing of Light Absorption Property of the Photoinitiator XBPO

Test method: the crystal product of the present disclosure and the crystalline form I of XBPO as a comparative product, were each dissolved in dichloromethane at a concentration of 4 mmol/L and then characterized by UV-Vis.

Figure 7:
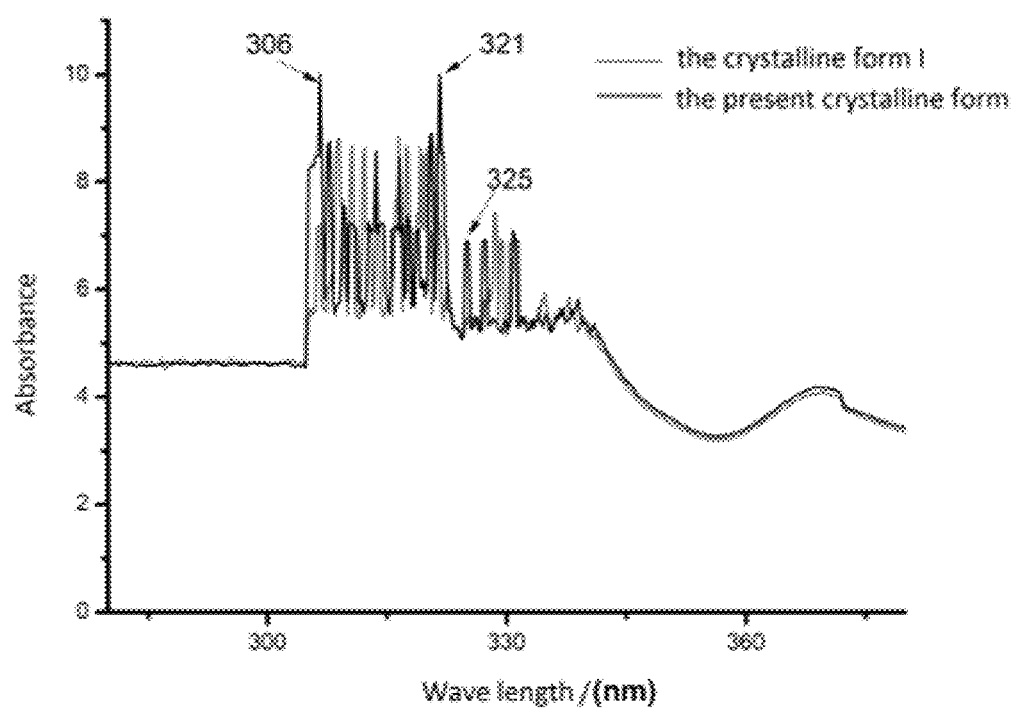
FIG. 7 shows a comparison of optical absorption properties between the crystalline form of XBPO according to the present disclosure and the crystalline form I of XBPO made according to the existing methods.

As a result, as indicated in FIG. 7, the present crystal product has significantly increased absorbances at 306 nm, 321 nm, and 325 nm. In particular, the comparative crystal product has absorbances of 7.2, 5.7, and 5.3 at 306 nm, 321 nm, and 325 nm, respectively, while the present crystal product has absorbances of 10, 10, and 6.9 at 306 nm, 321 nm, and 325 nm, respectively, with an increase of 1.4, 1.8, and 1.3 times the absorbances of the comparative product, respectively.

Test 2: Testing of Photoinitiation Property of the Photoinitiator XBPO

Two UV-curable coating materials were prepared using the present crystal product and the crystalline form I of XBPO made according to the existing methods as a comparative product, respectively. Thereafter, two PET films coated with the respective UV-curable coating materials were cured using a UV curing device. The degree of curing was measured by finger touch, and the shortest time taken for such curing was recorded. The shorter the curing time, the better the photoinitiation property of the photoinitiator XBPO.

As a result, the curing of the UV-curable coating material prepared from the present crystal product took 45 seconds, while the crystalline form I made according to the existing methods took 60 seconds. This indicates a substantially improvement in the photoinitiation property of the present crystal product.

Therefore, the new crystalline form of XBPO according to the present disclosure has substantially increased light absorption and photoinitiation properties. According to the disclosure, the crystallization method for making the new crystalline form of XBPO is an anti-solvent crystallization process, which can be carried out at a constant temperature and has advantages such as simple process, mild conditions, short production cycle, high yield of greater than 90%, and high purity of 99% or greater. Moreover, the main and auxiliary raw materials used are cheap, and readily available and cause low environmental pollution. So, the method of the present disclosure is easy to realize industrialization production.

The present disclosure describes and provides a method for making a new crystalline form of phenyl bis (2,4,6-trimethylbenzoyl) phosphine oxide. It should be noted that the raw materials and process parameters can be varied by those skilled in the art based on the above description. The present disclosure has been described with reference to preferred embodiments. It will be apparent to those skilled in the art that appropriate modifications and combinations may be made without departing from the spirit and scope of the present disclosure. Particularly it must be noted that all similar substitutions and modifications will be obvious to those skilled in the art, and should fall within the spirit and scope of the disclosure.

What is claimed is:

1. A crystalline form of bis(2,4,6-trimethylbenzoyl)phenylphosphine oxide with a large particle size, having:
   an X-ray powder diffraction pattern comprising characteristic peaks at 4.7±0.1, 9.3±0.1, 12.2±0.1, 13.5±0.1, 14.0±0.1, 16.2±0.1, 17.3±0.1, 18.7±0.1, 19.6±0.1, and 24.9±0.1 degrees 2θ; wherein, the crystalline form belongs to a triclinic crystal system and to a space group P-1;
   and wherein, the crystalline form is characterized by unit cell parameters equal to the following:
   cell dimensions from single crystal:
   a=8.0301(16)Å
   b=8.6673(17)Å
   c=19.252(4)Å
   α=84.07(3)°

β=82.83(3°)
γ=63.75(3°)
molecules/unit cell (Z): 2.

2. The crystalline form of claim 1, having:
a melting point measured by differential scanning calorimetry of 117° C. to 121° C.; and
a thermo-gravimetric analysis profile showing that the crystalline form starts to lose weight at 110±1° C. with a weight loss of 6.9±0.1% and starts to decompose and thus lose weight at 160±1° C.

3. A crystallization method for making the crystalline form of bis(2,4,6-trimethylbenzoyl) phenylphosphine oxide with a large particle size according to claim 1, comprising steps of:
(1) adding a solid of bis(2,4,6-trimethylbenzoyl)phenylphosphine oxide to a solvent and mixing with stirring, followed by heating to 50 to 70° C. to achieve complete dissolution and cooling the solution to room temperature; and
(2) adding an anti-solvent to the solution obtained in the step (1) to cause precipitation of crystals and allowing the crystals to grow at a constant temperature for 10 to 60 minutes, so as to give a slurry containing the crystals, which is subjected to filtration and then drying to obtain a crystal product of bis(2,4,6-trimethylbenzoyl)phenylphosphine oxide.

4. The method of claim 3, wherein the ratio of the solid bis(2,4,6-trimethylbenzoyl) phenylphosphine oxide to the solvent in the step (1) is 0.125 to 0.159 g/mL.

5. The method of claim 3, wherein the solvent used in the step (1) is a ketone, an ester, or a mixture thereof, wherein the ketone is selected from acetone, 2-butanone, cyclohexanone, and methyl isobutyl ketone, and wherein the ester is selected from methyl acetate, ethyl acetate, ethyl n-valerate, ethyl propionate, and n-butyl acetate.

6. The method of claim 3, wherein the stirring is carried out with a stirring speed of 50 to 300 rpm.

7. The method of claim 3, wherein the anti-solvent is an alcohol, an alkane, or a mixture thereof,
wherein the alcohol is selected from methanol, ethanol, isopropanol, ethylene glycol, and glycerol, and wherein the alkane is selected from n-heptane, cyclopentane, n-hexane, and petroleum ether.

8. The method of claim 3, wherein the anti-solvent is used in an amount of 0.4 to 3 times by volume the amount of the solvent used in the step (1), and is added to the solution obtained in the step (1) at a rate of 0.2 to 45% by volume with respect to the total volume of the anti-solvent per minute.

9. The method of claim 3, wherein the drying is carried out under vacuum at 50° C. to 60° C. until constant weight is reached.

10. A crystalline form of bis(2,4,6-trimethylbenzoyl)phenylphosphine oxide with large particle size, having:
an X-ray powder diffraction pattern comprising characteristic peaks at 4.7±0.1, 9.3±0.1, 12.2±0.1, 13.5±0.1, 14.0±0.1, 16.2±0.1, 17.3±0.1, 18.7±0.1, 19.6±0.1, and 24.9±0.1 degrees 2θ; wherein, the crystalline form belongs to a triclinic crystal system and to a space group P-1;
and wherein, the crystalline form is characterized by unit cell parameters substantially equal to the following:
cell dimensions from single crystal:
a=8.0301(16)Å
b=8.6673(17)Å
c=19.252(4)Å
α=84.07(3°)
β=82.83(3°)
γ=63.75(3°)
molecules/unit cell (Z): 2;
wherein the crystalline form of bis(2,4,6-trimethylbenzoyl)phenylphosphine oxide is fabricated in accordance with the steps:
(1) adding a solid of bis(2,4,6-trimethylbenzoyl)phenylphosphine oxide to a solvent and mixing with stirring, followed by heating to 50 to 70° C. to achieve complete dissolution and cooling the solution to room temperature; and
(2) adding an anti-solvent to the solution obtained in the step (1) to cause precipitation of crystals and allowing the crystals to grow at a constant temperature for 10 to 60 minutes, so as to give a slurry containing the crystals, which is subjected to filtration and then drying to obtain a crystal product of bis(2,4,6-trimethylbenzoyl)phenylphosphine oxide.

11. The crystalline form of claim 10, having:
a melting point measured by differential scanning calorimetry of 117 to 121° C.; and
a thermo-gravimetric analysis profile showing that the crystalline form starts to lose weight at 110±1° C. with a weight loss of 6.9±0.1% and starts to decompose and thus lose weight at 160±1° C.

12. The crystalline form of claim 11, wherein the ratio of the solid bis(2,4,6-trimethylbenzoyl) phenylphosphine oxide to the solvent in the step (1) is 0.125 to 0.159 g/mL.

13. The crystalline form of claim 11, wherein:
the anti-solvent is an alcohol, an alkane, or a mixture thereof,
the alcohol is selected from methanol, ethanol, isopropanol, ethylene glycol, and glycerol, and
the alkane is selected from n-heptane, cyclopentane, n-hexane, and petroleum ether.

* * * * *